United States Patent
Goka et al.

(10) Patent No.: US 9,954,544 B2
(45) Date of Patent: Apr. 24, 2018

(54) CPT RESONANCE GENERATION METHOD, CPT RESONANCE DETECTION METHOD, CPT RESONANCE GENERATION APPARATUS, ATOMIC OSCILLATOR AND MAGNETIC SENSOR

(71) Applicants: Shigeyoshi Goka, Tokyo (JP); Yuichiro Yano, Tokyo (JP); Takumi Ide, Tokyo (JP)

(72) Inventors: Shigeyoshi Goka, Tokyo (JP); Yuichiro Yano, Tokyo (JP); Takumi Ide, Tokyo (JP)

(73) Assignees: RICOH COMPANY, LTD., Tokyo (JP); TOKYO METROPOLITAN UNIVERSITY, Tokyo (JP)

( * ) Notice: Subject to any disclaimer, the term of this patent is extended or adjusted under 35 U.S.C. 154(b) by 107 days.

(21) Appl. No.: 15/065,806

(22) Filed: Mar. 9, 2016

(65) Prior Publication Data
US 2016/0269037 A1  Sep. 15, 2016

(30) Foreign Application Priority Data
Mar. 12, 2015 (JP) .................................. 2015-049161

(51) Int. Cl.
H03B 17/00 (2006.01)
H03L 7/26 (2006.01)
G04F 5/14 (2006.01)
G01R 33/26 (2006.01)

(52) U.S. Cl.
CPC ................ *H03L 7/26* (2013.01); *G04F 5/145* (2013.01); *G01R 33/26* (2013.01)

(58) Field of Classification Search
CPC ............ H03L 7/26; G04F 5/145; G01R 33/26
USPC ................. 372/109, 32, 26, 18; 331/3, 94.1; 250/251
See application file for complete search history.

(56) References Cited

U.S. PATENT DOCUMENTS

| | | | |
|---|---|---|---|
| 7,501,906 B2 | 3/2009 | Dimarcq et al. | |
| 7,944,317 B2 | 5/2011 | Strabley et al. | |
| 9,136,851 B2 | 9/2015 | Yano et al. | |

(Continued)

FOREIGN PATENT DOCUMENTS

| | | | |
|---|---|---|---|
| CN | 104317185 A | * | 1/2015 |
| JP | 2010-062554 | | 3/2010 |

(Continued)

*Primary Examiner* — Arnold Kinkead
(74) *Attorney, Agent, or Firm* — Cooper & Dunham LLP

(57) ABSTRACT

A method for generating a CPT resonance, includes applying an electric current to a laser light-emitting element, to emit laser light having at least two wavelengths. The value of a direct current component of the electric current applied to the laser light-emitting element in a first period is greater than an oscillation threshold for the laser light-emitting element, and the value of the direct current component of the electric current applied to the laser light-emitting element in a second period, following the first period, is less than the value of the direct current component of the electric current in the first period. An alkali metal atom is irradiated with the laser light, the laser light generated in the first period and the laser light generated in the second period entering the alkali metal atom repeatedly a plurality of times to generate a Ramsey resonance.

18 Claims, 7 Drawing Sheets

(56) References Cited

U.S. PATENT DOCUMENTS

| | | | |
|---|---|---|---|
| 2013/0056458 A1 | 3/2013 | Yun et al. | |
| 2014/0292426 A1* | 10/2014 | Maki | G04F 5/145 331/94.1 |
| 2015/0222285 A1 | 8/2015 | Goka et al. | |

FOREIGN PATENT DOCUMENTS

| | | |
|---|---|---|
| JP | 4801044 | 10/2011 |
| JP | 2014-049886 | 3/2014 |

* cited by examiner

US 9,954,544 B2

CPT RESONANCE GENERATION METHOD, CPT RESONANCE DETECTION METHOD, CPT RESONANCE GENERATION APPARATUS, ATOMIC OSCILLATOR AND MAGNETIC SENSOR

CROSS-REFERENCE TO RELATED APPLICATIONS

The present application claims benefit of priority under 35 U.S.C. § 119 of Japanese Patent Application No. 2015-049161, filed Mar. 12, 2015. The contents of this application are incorporated herein by reference in their entirety.

BACKGROUND OF THE INVENTION

1. Field of the Invention

The disclosures herein generally relate to a CPT resonance generation method, a CPT resonance detection method, a CPT resonance generation apparatus, an atomic oscillator and a magnetic sensor.

2. Description of the Related Art

An atomic clock is an extremely accurate clock. Technologies for reducing the size of the atomic clock are being studied. The atomic clock is an oscillator based on the transition energy of an electron included in an atom of alkali metal or the like. In particular, the electron transition energy of an alkali metal atom is found to be quite accurate if the process is not influenced by any disturbance. Accordingly, stability of the frequency, which is an improvement of several orders of magnitude compared with a crystal oscillator, can be obtained.

Because a conventional atomic oscillator requires a structure of a microwave oscillator, the atomic oscillator of the related art has a large size and requires a large amount of electric power. However, by using an atomic resonance called a CPT (Coherent Population Trapping), the oscillator becomes unnecessary, and it becomes possible to manufacture an atomic oscillator having quite a small size. A prototype of the CPT type atomic oscillator was manufactured in 2007, and products of the CPT type atomic oscillator have been sold by Symmetricom, Inc., U.S.A. since 2011.

The CPT type atomic oscillator includes, as shown in FIG. 1, a light source 910 such as a laser light-emitting element, an alkali metal cell 940 in which alkali metals are encapsulated, and a light detector 950 which receives laser light that passes through the alkali metal cell 940. The laser light from the light source 910 is modulated by sideband wavelengths appearing on both sides of a carrier wave which are specific wavelengths, and excites electrons in alkali metal atoms with two simultaneous transitions of the electrons.

The transition energy of the above transition is constant. When the sideband wavelength of the laser light coincides with a wavelength corresponding to the transition energy, a transparency phenomenon occurs, in which absorption of light by the alkali metal is reduced. Then, while a wavelength of the carrier wave is adjusted so that the absorption of light by the atomic metal is reduced, a signal detected by the light detector 950 is fed back to a modulator 960, and a modulation frequency of the laser light from the light source 910 such as a laser element is adjusted by the modulator 960. The laser light is emitted from the light source 910 and is transmitted onto the alkali metal cell 940 via a collimator lens 920 and a quarter wavelength plate 930, and enters the light detector 950.

Although, the CPT atomic oscillator is smaller and consumes less power in comparison to oscillators of the related art, oscillators of the related art exhibit better frequency stability, and further improvement of frequency stability in CPT oscillators is desired. As a powerful method for improving the frequency stability, a method for pulsing a laser light has been studied.

For the CPT type atomic oscillator, there are mainly two methods of pulsing laser light. A first method of pulsing laser light is to use an external apparatus. In the first method, a laser light-emitting element is caused to continuously emit light and the wavelength of the laser light-emitting element is caused to coincide with the absorption line of the atom, and thereby the frequency is stabilized. The laser light is pulsed by causing an external device such as an Acousto-Optic Modulator (AOM) or a liquid-crystal polarizer to intervene. In the first method, it is easy to stabilize the laser wavelength, but there is a problem of increasing a volume, cost and power consumption.

A second method of pulsing laser light is to use a direct modulation. The second method does not require a specific device other than the laser light-emitting element, and enables reducing the size, cost and power consumption of the entire apparatus, compared with the case of using an external device. As an example of the second method, a technique of superposing a microwave with a direct electric current input to the laser light-emitting element to perform modulation is proposed (for example, see US Patent Application Publication No. 2013/0056458).

SUMMARY OF THE INVENTION

It is a general object of at least one embodiment of the present invention to provide a CPT resonance generation method, a CPT resonance detection method, a CPT resonance generation apparatus, an atomic oscillator and a magnetic sensor that substantially obviate one or more problems caused by the limitations and disadvantages of the related art.

In one embodiment, a coherent population trapping (CPT) resonance generation method, includes applying an electric current to a laser light-emitting element, to cause the emission of laser light having at least two wavelengths, wherein a first value of a direct current component of the electric current applied to the laser light-emitting element in a first period is greater than an oscillation threshold for the laser light-emitting element, and a second value of the direct current component of the electric current applied to the laser light-emitting element in a second period, following the first period, is less than the first value of the direct current component of the electric current in the first period; and irradiating an alkali metal atom with the laser light, the laser light generated in the first period and the laser light generated in the second period entering the alkali metal atom repeatedly a plurality of times to generate a Ramsey resonance.

In another embodiment, a method is used to detect the CPT resonance generated by a CPT resonance generation method, which includes applying an electric current to a laser light-emitting element, to emit laser light having at least two wavelengths, wherein a first value of a direct current component of the electric current applied to the laser light-emitting element in a first period is greater than an oscillation threshold for the laser light-emitting element, and a second value of the direct current component of the electric current applied to the laser light-emitting element in a second period, following the first period, is less than the first value of the direct current component of the electric current in the first period; and irradiating an alkali metal atom with the laser light, the laser light generated in the first period and the laser light generated in the second period entering the alkali metal atom repeatedly a plurality of times, to generate a Ramsey resonance. The wavelength of the laser light in the first period is varied by increasing the wavelength from a value less than an absorption wavelength of the alkali metal atom to a value greater than the absorption wavelength; and decreasing the wavelength from the value greater than the absorption wavelength to the absorption wavelength. The method includes detecting light passing through the alkali metal atom, when the wavelength of the laser light coincides with the absorption wavelength during the wavelength is increased.

In yet another embodiment, a CPT resonance generation apparatus includes an alkali metal cell in which an alkali metal atom is encapsulated, and which laser light having at least two wavelengths enters; a laser light-emitting element configured to emit the laser light; and a power-supply unit configured to apply an electric current to the laser light-emitting element, wherein a first value of a direct current component of the applied electric current in a first period is greater than an oscillation threshold for the laser light-emitting element; a second value of the direct current component of the applied electric current in a second period, following the first period, is less than the first value of the direct current component; and the first period and the second period are repeated a plurality of times.

In yet another embodiment, an atomic oscillator includes the CPT resonance generation apparatus including an alkali metal cell in which an alkali metal atom is encapsulated, and which laser light having at least two wavelengths enters; a laser light-emitting element configured to emit the laser light; and a power-supply unit configured to apply electric current to the laser light-emitting element, wherein a first value of a direct current component of the applied electric current in a first period is greater than an oscillation threshold for the laser light-emitting element; a second value of the direct current component of the applied electric current in a second period, following the first period, is less than the first value of the direct current component; and the first period and the second period are repeated a plurality of times; and a light reception unit configured to receive light passing through the alkali metal cell.

In yet another embodiment, a magnetic sensor includes the CPT resonance generation apparatus including an alkali metal cell in which an alkali metal atom is encapsulated, and which laser light having at least two wavelengths enters; a laser light-emitting element configured to emit the laser light; and a power-supply unit configured to apply electric current to the laser light-emitting element, wherein a first value of a direct current component of the applied electric current in a first period is greater than an oscillation threshold for the laser light-emitting element; a second value of the direct current component of the applied electric current in a second period, following the first period, is less than the first value of the direct current component; and the first period and the second period are repeated a plurality of times; and a light reception unit configured to receive light passing through the alkali metal cell.

BRIEF DESCRIPTION OF THE DRAWINGS

Other objects and further features of embodiments will become apparent from the following detailed description when read in conjunction with the accompanying drawings, in which.

DESCRIPTION OF THE PREFERRED EMBODIMENTS

Figure 1:
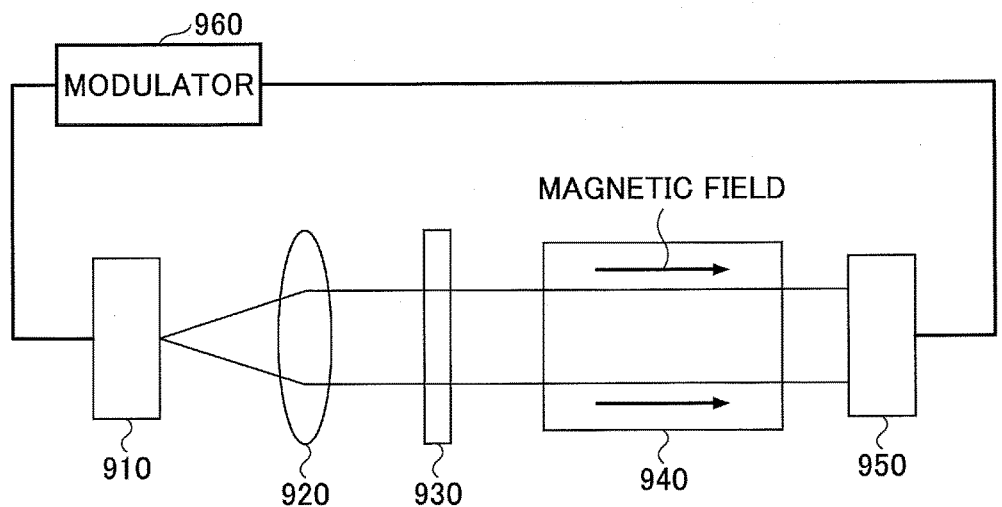
FIG. 1 is an explanatory diagram illustrating an example of an atomic oscillator according to embodiments.

In the following, embodiments of the present invention will be described with reference to the accompanying drawings. In each drawing, the same reference numerals are assigned to the same components and duplicate explanation is omitted.

First Embodiment

In a first embodiment, a CPT resonance generation apparatus, and a CPT resonance generation method and a CPT resonance detection method using the CPT resonance generation apparatus will be described.

Figure 2:
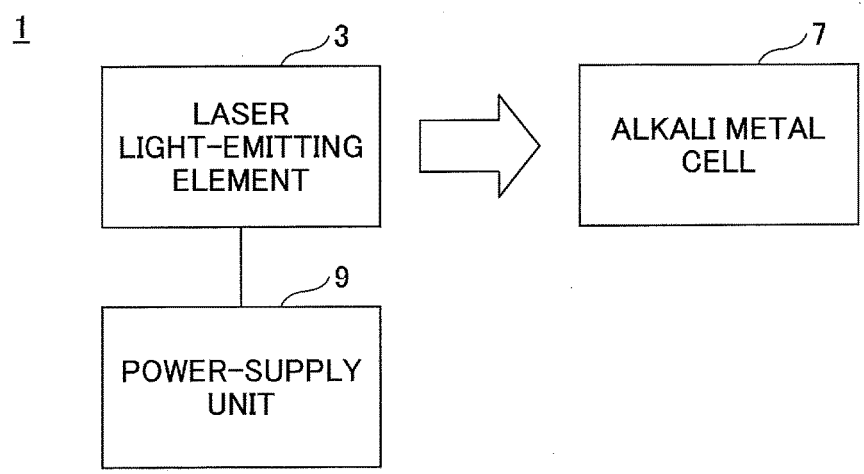
FIG. 2 is a block diagram illustrating an example of a basic configuration according to a first embodiment of a CPT resonance generation apparatus.

FIG. 2 is a block diagram illustrating an example of a basic configuration of the CPT resonance generation apparatus according to the first embodiment. As shown in FIG. 2, the CPT resonance generation apparatus 1 includes a laser light-emitting element 3, an alkali metal cell 7 and a power-supply unit 9.

For the CPT resonance generation apparatus 1, a direct modulation method is employed in which pulse electric current is input from the power-supply unit 9 into the laser light-emitting element 3, and thereby an output from the laser light-emitting element 3 is directly pulsed. The CPT resonance generation apparatus 1 does not require a specific device other than the laser light-emitting element 3, and it becomes possible to reduce the size, cost and power consumption of the entire apparatus, compared with a case of using an external device, such as an AOM or a liquid crystal polarizer. In the following, operations or the like of the CPT resonance generation apparatus 1 will be explained in detail.

The laser light-emitting element 3 is a light source for irradiating the alkali metal cell 7 with laser light. As the laser light-emitting element 3, for example a vertical cavity surface emitting laser (VCSEL) can be used.

The alkali metal cell 7 is a cell in which a gas of alkali metal atoms is encapsulated. As the alkali metal, for example, rubidium (Rb), cesium (Cs), sodium (Na), potassium (K) or the like may be used. Alternatively, buffer a gas may be encapsulated in the alkali metal cell 7 with the gas of alkali metal atoms.

The power-supply unit 9 applies an electric current to the laser light-emitting element 3. The power-supply unit 9 generates a pulsed waveform, and adds a modulated signal of high frequency (e.g. 4.6 GHz) to the pulsed waveform or the like. The power-supply device 9 can cause the laser light-emitting element 3 to generate laser light having at least two wavelengths. This operation will be described later with reference to FIGS. 7, 8 and the like.

The power-supply unit 9 causes the laser light-emitting element 3 to emit light and to irradiate the alkali metal cell 7 with laser light, thereby a pulse excitation is performed. Here, the pulse excitation is to irradiate atoms with laser light several times, at predetermined intervals, and is a method for generating a Ramsey resonance. Application of the present method allows the line width of CPT resonance to be narrowed, improves the S/N ratio (contrast), and enhances the short-term stability.

The Ramsey resonance is a phenomenon that occurs when an atom is irradiated with laser light several times at predetermined intervals, the probability of the atom to transition to other energy levels according to an interaction between laser light and the atom becomes sensitive to a change in a frequency of the laser light. According to the above-described phenomenon, the transition frequency can be measured with high accuracy.

Figure 3:
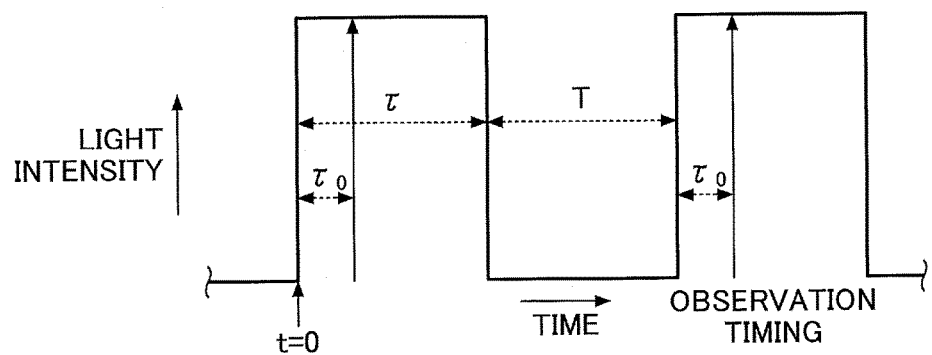
FIG. 3 is an explanatory diagram illustrating an example of a method according to the embodiment for observing a CPT resonance based on a pulse excitation method.

FIG. 3 is an explanatory diagram illustrating a method for observing a CPT resonance based on the pulse excitation method. As shown in FIG. 3, in a case of performing a pulse excitation using pulsed light which periodically repeats ON and OFF, CPT resonances are sufficiently excited, and then, laser light is blocked, a free evolution time T is caused to elapse, then an observation is performed, thereby the Ramsey resonance becomes observable.

Therefore, an observation when a time period $\tau_0$ has elapsed ($t=\tau_0$) from a rise ($t=0$) of a pulse and a sufficient excitation of an atom during a time period to an end of the pulse ($t=\tau$) are repeated. Required conditions for the above-described operation are (1) the atom is sufficiently excited at the end of the pulse, (2) the time period for observation $\tau_0$ is sufficiently short, and (3) a laser wavelength at the excitation is the same as a laser wavelength at the observation. However, in the pulse excitation method as shown in FIG. 3, it is difficult to achieve conditions (2) and (3).

Therefore, in the present embodiment, the pulse excitation method shown in FIG. 3 is improved to achieve conditions (2) and (3). Specifically, as shown in an upper part of FIG. 4, a first period $\tau$ and a second period T are repeated several times, to generate a Ramsey resonance.

In the first period $\tau$, the laser light-emitting element 3 emits light, and a pulsed waveform, in which a value of a DC (direct current) component of an electric current applied to the laser light-emitting element 3 is greater than an oscillation threshold for the laser light-emitting element 3, is applied to the laser light-emitting element 3.

Specifically, in the first period $\tau$, an electric current I, obtained by overdriving around the rise of the normal pulsed electric current for the laser light-emitting element 3, from the power-supply unit 9 is applied as an input electric current to the laser light-emitting element 3. The electric current I can include an electric current $I_1$ of a first stage immediately after the rise ($t=0$) and an electric current $I_2$ of a second stage, the value of which is less than the electric current $I_1$ of the first stage. Here, both values of the electric currents $I_1$ and $I_2$ are greater than the oscillation threshold for the laser light-emitting element 3.

As the electric current $I_1$ of the first stage, an electric current having a value greater than the normal pulsed electric current for the laser light-emitting element 3 is input, and thereby increasing the rate of temperature inside the laser light-emitting element 3, and thereby drastically reducing a rise time of output wavelength. Thereafter, the value of electric current is changed to the electric current $I_2$ of the second stage, which is less than the electric current $I_1$ of the first stage, which is controlled so that the output wavelength of the laser light-emitting element 3 near the end of the pulse coincides with the absorption line L.

In the second period T (free evolution state) following the first period $\tau$, the value of a DC component in the electric current applied to the laser light-emitting element 3 is set to be less than the value of a DC component of the electric current in the first period $\tau$. In the second period T, the value of the DC component of the electric current applied to the laser light-emitting element 3 is preferably less than the oscillation threshold for the laser light-emitting element 3, and the value of the DC component may be zero.

In this way, the value of the DC component in the electric current applied to the laser light-emitting element 3 in the second period T is set to be less than the value of the DC component in the electric current applied to the laser light-emitting element 3 in the first period $\tau$, and thereby a light amount of the laser light in the second period T decreases. Therefore, the light shift can be reduced.

In particular, in a case where the value of the DC component in the electric current applied to the laser light-emitting element 3 in the second period T is set lower than the oscillation threshold for the laser light-emitting element 3 (including a case of zero), the laser light-emitting element 3 is does not emit light in the second period T. Therefore, the laser light emitted to alkali metal atoms can be completely blocked, and the light shift can be considerably reduced.

Figure 4:
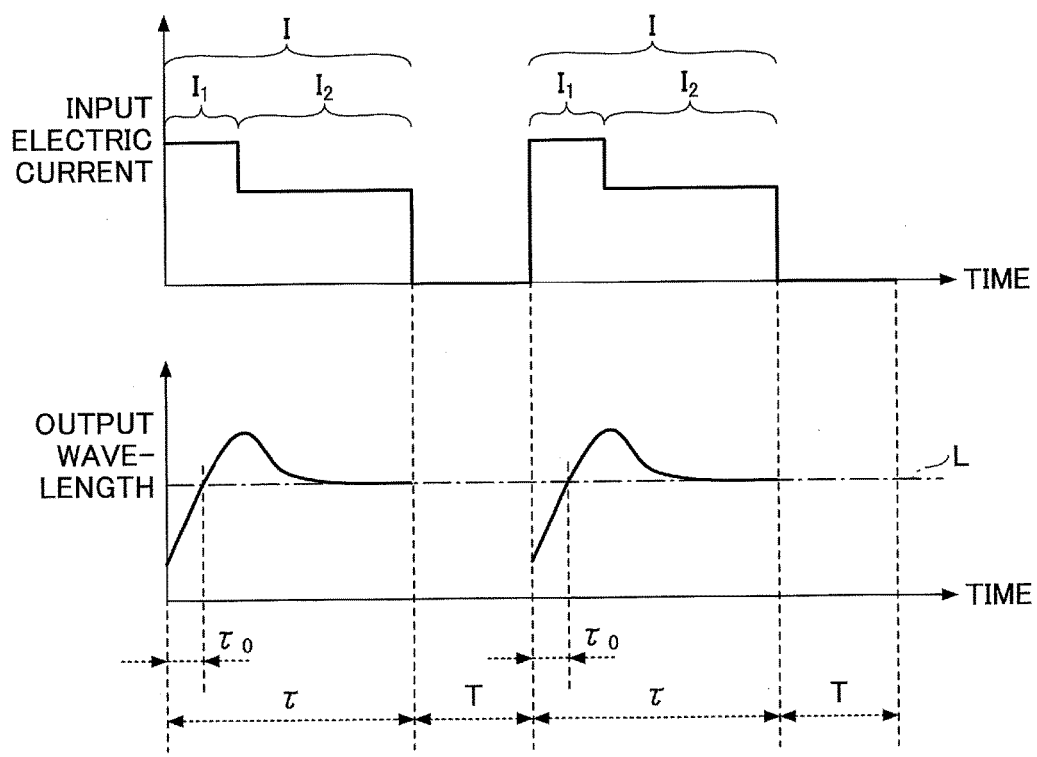
FIG. 4 is an explanatory diagram illustrating an example of a relation between an input electric current and an output wavelength of a VCSEL according to the embodiment.

As shown in the lower part of FIG. 4, the first period $\tau$, includes a period in which the output wavelength from the laser light-emitting element 3 increases to a value greater than the absorption line L and a period in which the output wavelength from the laser light-emitting element 3 decreases from the value greater than the absorption line L towards the absorption line L. In other words, the output wavelength from the laser light-emitting element 3 once passes the absorption line L when the time period $\tau_0$ has elapsed from the rise ($t=0$) of the pulse and then decreases so as to coincide with the absorption line L again.

During the period where the output wavelength from the laser light-emitting element 3 increases, shown in the lower part of FIG. 4, a CPT resonance is detected when the output wavelength from the laser light-emitting element 3 coincides with the absorption line L. In this way, the CPT resonance is detected when the time period $\tau_0$ has elapsed from the rise ($t=0$) of the pulse, where the output wavelength which is increasing passes the absorption line L first, and thereby the above-described conditions (2) and (3), necessary for observing the pulse excitation, can be achieved. Here, the absorption line L is an absorption wavelength of alkali metal encapsulated in the alkali metal cell 7.

Furthermore, in the second period T, in a case where the DC component in the electric current input to the laser light-emitting element 3 is not completely blocked, but an electric current less than the oscillation threshold for the laser light-emitting element 3 is applied, the output wavelength quickly rises when the laser light-emitting element 3 emits light to generate a CPT resonance. As a result, the CPT resonance can be observed sooner, i.e. time period required for observing the CPT resonance $\tau_0$ becomes shorter.

In this way, in the CPT resonance generation method using the CPT resonance generation apparatus according to the first embodiment, the light shift can be reduced in comparison to the related art. In the following, various effects in addition to the above will be shown experimentally.

Experimental Equipment

Figure 5:
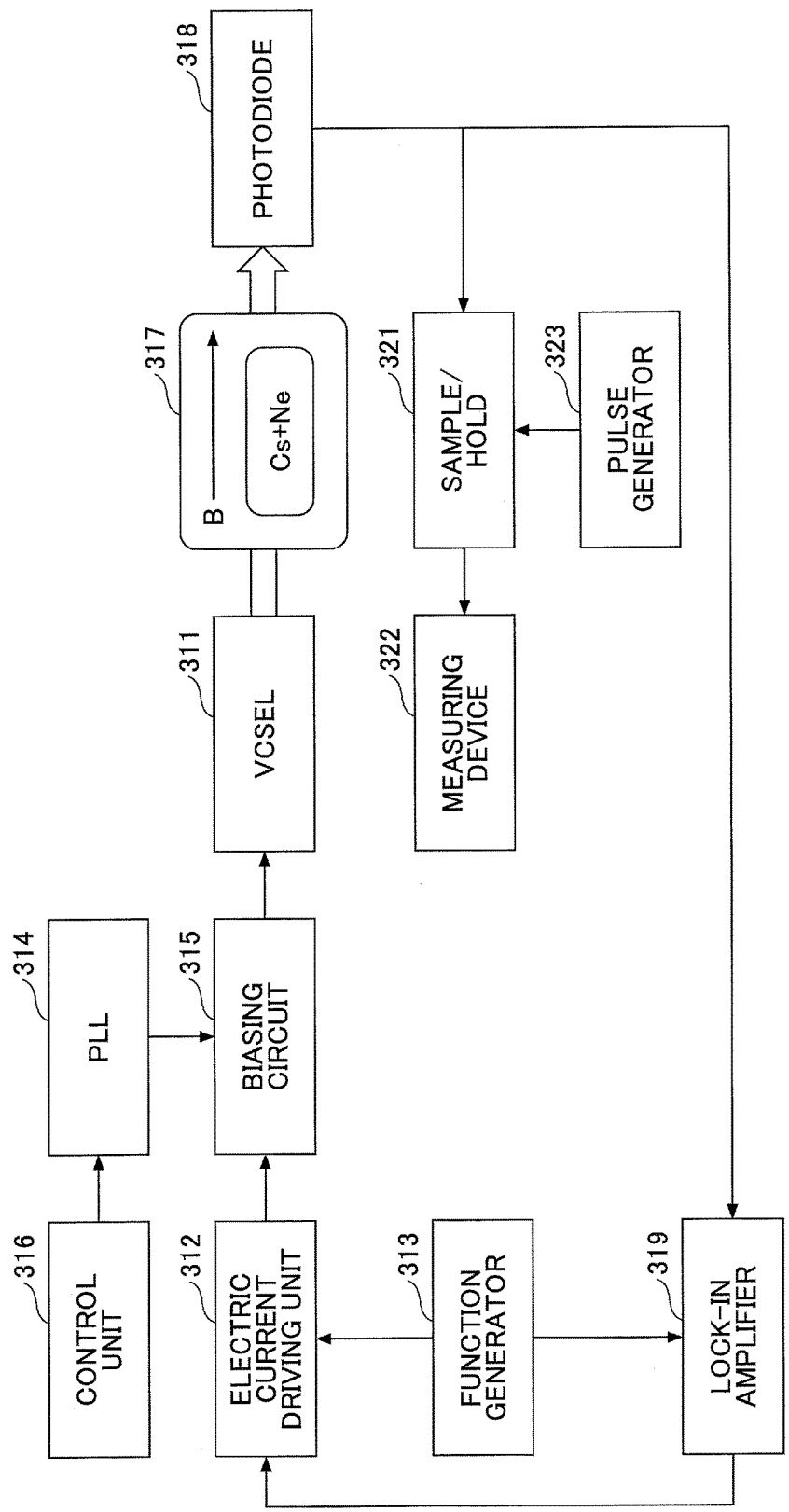
FIG. 5 is a block diagram illustrating an example of a configuration of an apparatus used for an experiment according to the embodiment.

Experimental equipment including the CPT resonance generation apparatus 1 according to the first embodiment, as shown in FIG. 5, is prepared, and experiments for generating and detecting CPT resonance are performed.

In FIG. 5, a VCSEL 311 is used for the laser light-emitting element for excitation. A temperature of the VCSEL 311 is kept constant. A power-supply unit including an electric current driving unit 312, a PLL (phase-locked loop) 314 and a biasing circuit 315 generates an electric current, in which a modulation signal with a frequency of 4.6 GHz is added to the electric current waveform shown in the upper part of FIG. 4, and applies the current to the VCSEL 311. A control signal is input to the PLL 314 from a control unit 316.

The alkali metal cell 317 has a shape of a cylinder with a diameter of 20 mm and a light path length of 10 mm. In the alkali metal cell 317, alkali atoms of cesium (Cs) and a buffer gas of neon (Ne) are encapsulated with an internal pressure of 4 kPa. The temperature of the alkali metal cell 317 is kept at 39.00° C., at which an S/N ratio of the CPT resonance is the greatest. In order to block external magnetic fields due to the geomagnetism or the like, a static magnetic field B is applied to the alkali metal cell 317.

The alkali metal cell 317 is irradiated with laser light from the VCSEL 311, the transmitted light is detected by a photodiode 318 serving as a light detection device. A signal of the photodiode 318, after a lock-in detection by a lock-in amplifier 319, is amplified and fed back to the electric current driving unit 312, in order to stabilize the wavelength of the laser light emitted from the VCSEL 311. A function generator 313 is coupled to the lock-in amplifier 319 and to the electric current driving unit 312.

In order to detect a CPT resonance, the signal of the photodiode 318 is coupled to a detector 322, such as an oscilloscope, via a sample hold circuit 321. To the sample hold circuit 321, a pulse generator 323 is coupled. By using the sample hold circuit 321, a CPT resonance can be detected within $\tau_0$, shown in FIG. 4.

Figure 6:
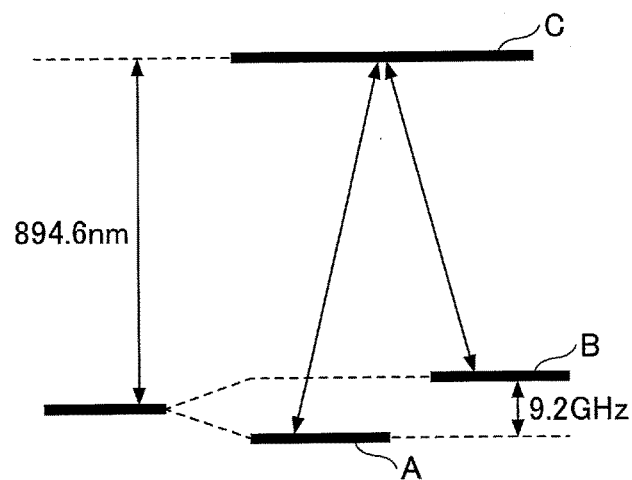
FIG. 6 is an explanatory diagram illustrating an example of an atomic energy level explaining a CPT type.

The present experimental equipment uses the characteristic, as shown in FIG. 6, that an absorption rate of light, for cesium (Cs) atoms encapsulated in the alkali metal cell, is reduced when electrons are excited from two ground levels A and B to an excited level C simultaneously. Therefore, for the VCSEL 311, an element emitting a carrier wave with a wavelength close to 894.6 nm is used. The wavelength of the carrier wave is adjusted by changing the temperature or an output of the VCSEL.

Figure 7:
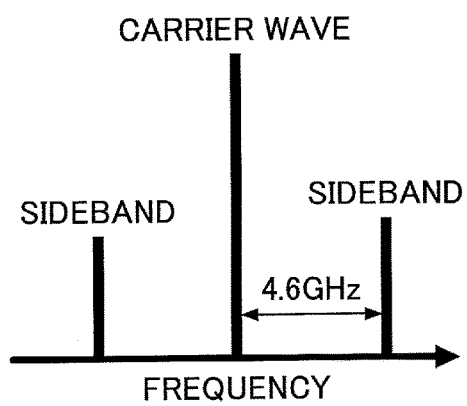
FIG. 7 is an explanatory diagram illustrating an example of an output wavelength upon a modulation of the VCSEL according to the embodiment.

Moreover, in the present experimental equipment, a laser light with at least two different wavelengths is generated. Specifically, as shown in FIG. 7, the frequency of the VCSEL 311 is modulated at 4.6 GHz, so that a difference between frequencies of sidebands generated by the modulation on both sides of the carrier wave around 894.6 nm coincides with the eigen frequency of the cesium (Cs) atoms, i.e. 9.2 GHz. A laser light having two different frequencies, which are the frequencies of the sidebands, is made incident to the alkali metal cell 317.

Figure 8:
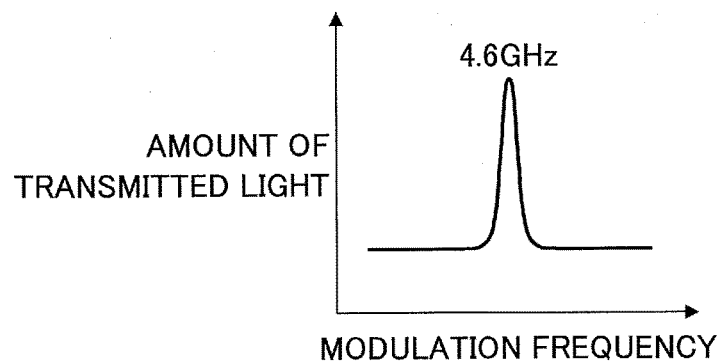
FIG. 8 is a correlation diagram illustrating an example of a correlation between a modulation frequency and an amount of transmitted light according to the embodiment.

As shown in FIG. 8, an amount of transmitted laser light through a gas of the excited Cs atoms in the alkali metal cell 317 reaches a maximum when the frequency difference of the sidebands corresponds to the difference of the eigen frequency of the Cs atoms. Accordingly, the modulation frequency for the VCSEL 311 is adjusted by the feedback so that an output from the photodiode 318 maintains the maximum value. Because the eigen frequency of an atom is quite stable, the modulation frequency takes a stable value, and this information is extracted as an output.

In this way, in this experimental equipment, the electric current in which the modulation signal of 4.6 GHz is added to the electric current waveform, shown in the upper part of FIG. 4, is input to the VCSEL 311, and the laser light having at least two wavelength is emitted to the Cs atoms in the alkali metal cell 317. Then, in the first period τ, shown in the lower part of FIG. 4, at the first passing the absorption line L when the time period $\tau_0$ has elapsed from the rise of the pulse, the light transmitted through the alkali metal cell 317 is detected by the photodiode 318.

In the experimental equipment, cesium (Cs) is used for the alkali metal and the VCSEL emitting light with a wavelength of 894.6 nm is employed for using the transition of the D1 line. In a case of using the D2 line of Cs, a VCSEL emitting light with a wavelength of 852.3 nm may be employed. Moreover, rubidium (Rb) may be used for the alkali metal. In a case of using the D1 line of Rb, a VCSEL emitting light with a wavelength of 795.0 nm may be employed. In a case of using the D2 line of Rb, a VCSEL emitting light with a wavelength of 780.2 nm may be employed. Furthermore, in the case of using rubidium (Rb), the modulation frequencies are 3.4 GHz and 1.5 GHz for $^{87}$Rb and $^{85}$Rb, respectively.

[Result of Experiment]

(First Result of Experiment: Contrast)

First, contrast characteristic of the CPT resonance applying the pulse excitation method shown in FIG. 4 (in the following, referred to as "present excitation method") using the experimental equipment shown in FIG. 5 is compared with the contrast characteristic of conventional CPT resonance according to the related art. The contrast is an index, generally used to indicate the S/N ratio of a CPT resonance, and is a ratio of a resonance amplitude to a DC component. As the contrast increases, enhancement of short-term stability can be expected.

Figure 9:
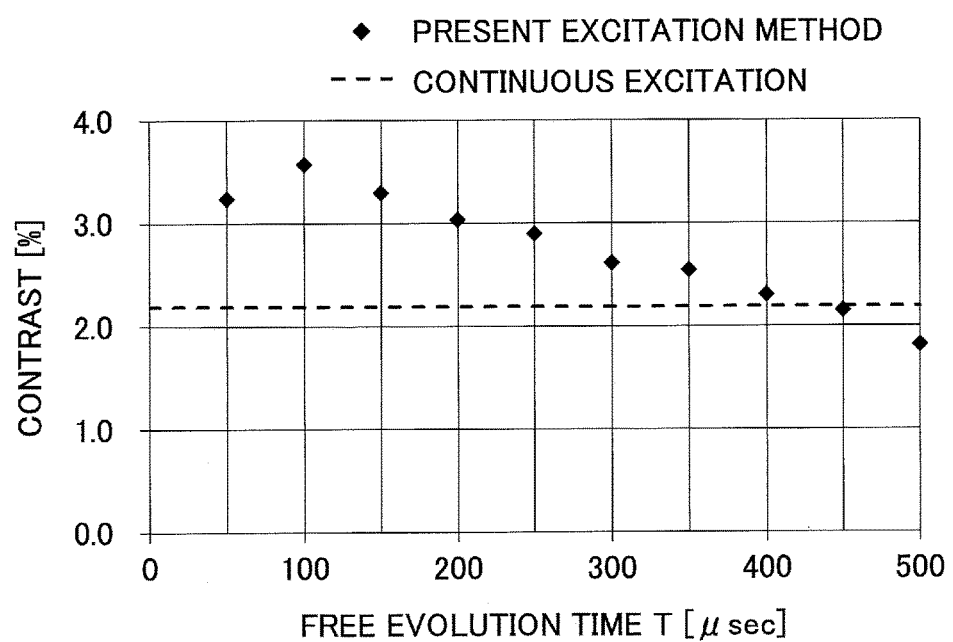
FIG. 9 is a diagram illustrating an example of experimentally obtained contrast characteristic according to the embodiment.

FIG. 9 is a diagram illustrating experimentally obtained contrast characteristic. In FIG. 9, squares represent contrasts obtained by using the present excitation method, and a dashed line represents contrasts obtained by using continuous excitation (The same applies to FIGS. 10 and 11). For the present excitation method, contrast is measured in a case of varying the second period T (free evolution time), shown in FIG. 4 (The same applies to FIGS. 10 and 11).

As shown in FIG. 9, the contrasts by the continuous excitation method are about 2.19%, whereas most of the contrasts by the present excitation method are greater than those of the continuous excitation method, and 3.57% at a maximum. That is, with the present excitation method, higher contrast can be obtained compared with the continuous excitation method, and short-term stability is also enhanced.

(Second Result of Experiment: Resonance Line Width)

Next, characteristic of resonance line width (full width half maximum: FWHM) of the CPT resonance by the present excitation method is compared with the FWHM resonance line width of the continuous excitation method of the related art. As the resonance line width decreases, enhancement of short-term stability can be expected.

Figure 10:
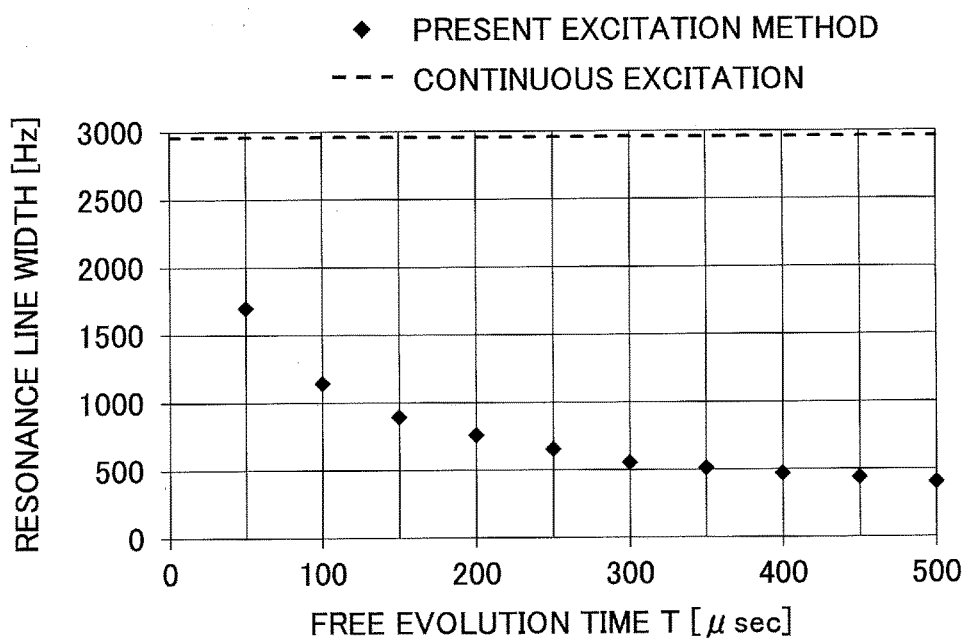
FIG. 10 is a diagram illustrating an example of experimentally obtained resonance line width characteristic according to the embodiment.

FIG. 10 is a diagram illustrating experimentally observed resonance line widths. As shown in FIG. 10, the resonance line widths by the continuous excitation method are about 2.96 kHz, whereas the resonance line widths by the present excitation method are narrower than those of the continuous excitation method, and 405 Hz at a minimum. That is, in the present excitation method, substantially narrower resonance line width can be obtained compared with the continuous excitation method, and short-term stability is also enhanced.

(Third Result of Experiment: Performance Index of Short-Term Stability)

Next, a performance index of short term stability of CPT resonance by the present excitation method is compared with that of CPT resonance by the continuous excitation method of the related art.

An Allan standard deviation is generally used as an index for expressing the stability of a frequency of CPT resonance. A short-term stability of the Allan standard deviation is proportional to a ratio of the resonance line width by the contrast. The smaller the ratio is, the better the characteristic is. Therefore, a value obtained by dividing the contrast by the resonance line width is used as a performance index.

Figure 11:
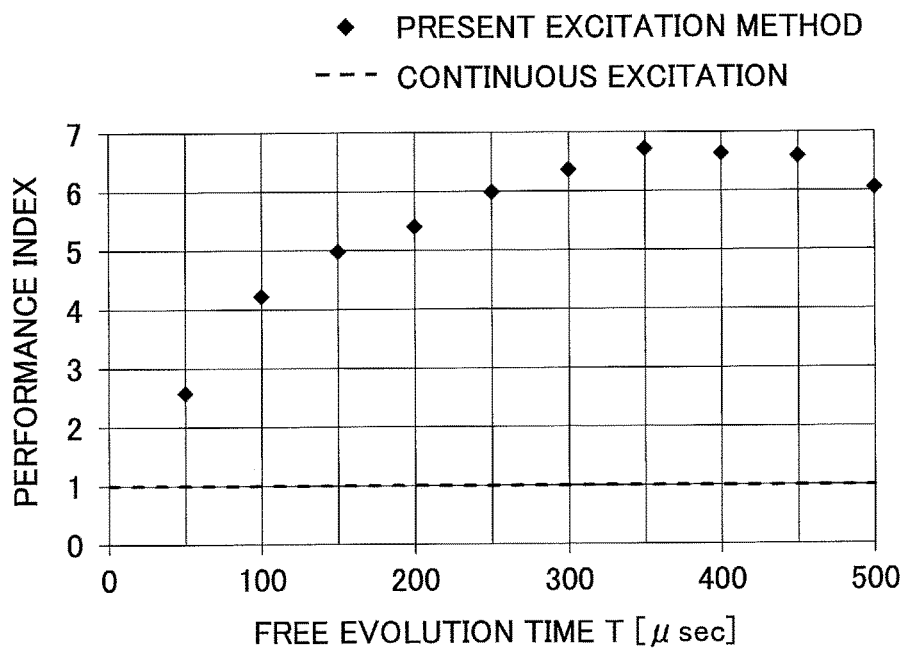
FIG. 11 is a diagram illustrating an example of an experimentally obtained performance index according to the embodiment.

FIG. 11 is a diagram illustrating experimentally observed performance index. Note that the values shown are normalized so that the performance index by continuous excitation is 1. As shown in FIG. 11, the performance indices by the present excitation method are greater than those by the continuous excitation method with a maximum of 6.72. That is, it is found that with the present excitation method, the performance is expected to be improved by 6.72 times compared with the continuous excitation method, and thereby effectiveness of the present excitation method is confirmed.

The method described in US Patent Application Publication No. 2013/0056458 includes a period where a direct electric current Idc, with which a microwave is superposed, is applied to the laser light-emitting element, followed by another period where only the direct electric current Idc is applied to the laser light-emitting element. That is, also in the period where the microwave electric current is not superposed, a direct current component (direct electric current Idc), which is the same as that in the period where the microwave electric current is superposed, is applied to the laser light-emitting element. Laser light is not blocked. Therefore, the occurrence of a light shift is a problem in the described method.

The light shift is a phenomenon in which the energy level of an alkali metal atom changes due to an interaction between the alkali metal atom and the light electric field of laser light, and thereby a resonance frequency shifts. An amount of shift changes linearly with changes in the light intensity. The light shift is a factor that reduces a long-term stability of the CPT type atomic oscillator.

According to the embodiment, a method of generating a CPT resonance with minimal light shift can be provided.

Second Embodiment

In a second embodiment, an atomic oscillator including the CPT resonance generation apparatus according to the first embodiment will be described as an example. In the second embodiment, explanations for the same or similar components as in the first embodiment may be omitted.

Figure 12:
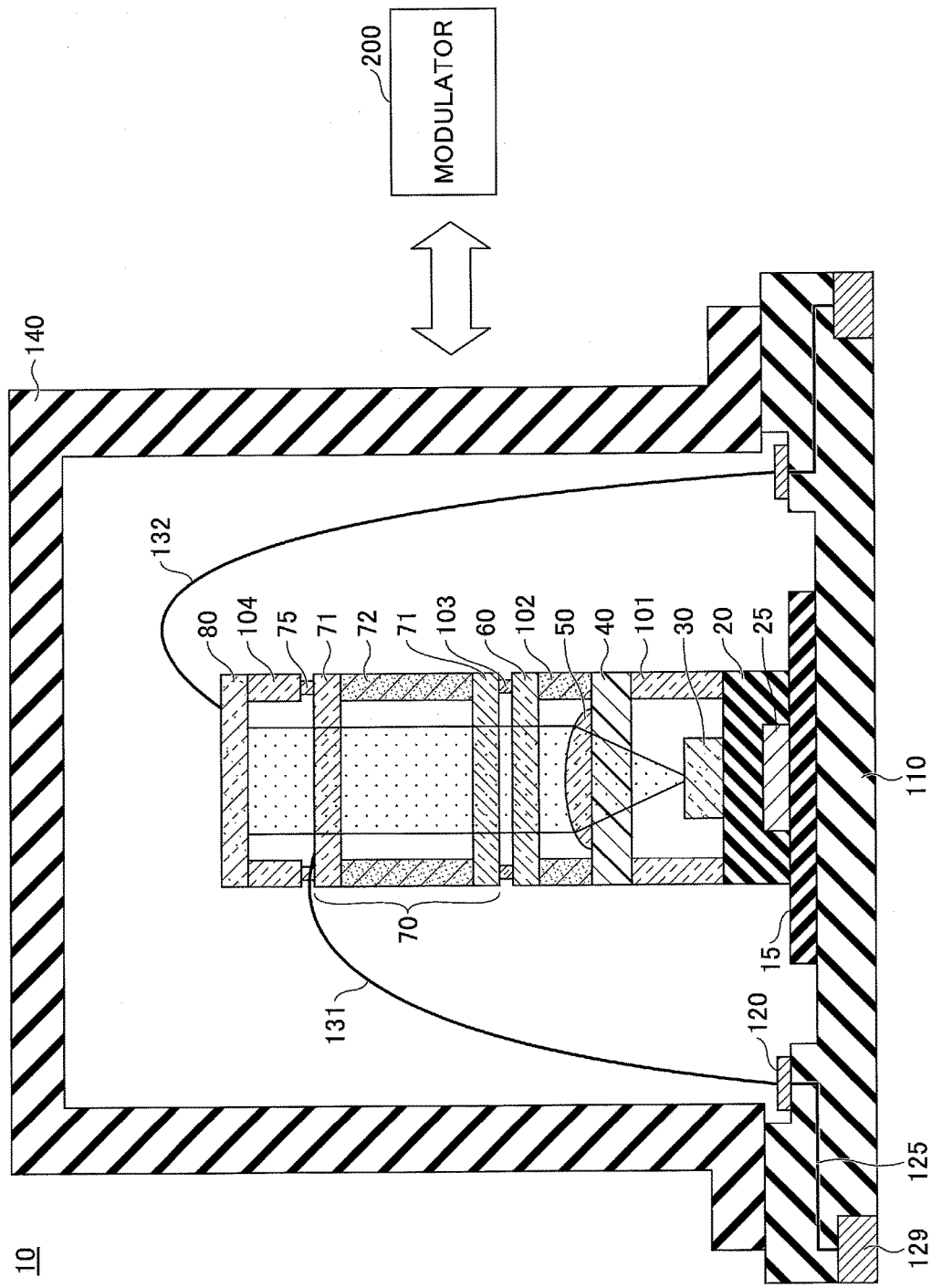
FIG. 12 is a diagram illustrating an example of a configuration of an atomic oscillator according to a second embodiment.

FIG. 12 is a diagram illustrating an example of a configuration of the atomic oscillator according to the second embodiment. As shown in FIG. 12, the atomic oscillator 10 includes as main members, a laser light-emitting element 30, a neutral density (ND) filter 40, a collimator lens 50, a quarter wavelength plate 60, an alkali metal cell 70, a light detector 80, a modulator 200 and the like.

In the atomic oscillator 10, light emitted from the laser light-emitting element 30 is made incident to the alkali metal cell 70 via the ND filter 40, the collimator lens 50 and the quarter wavelength plate 60, and excites electrons in the alkali metal atoms encapsulated in the alkali metal cell 70. Light transmitted through the alkali metal cell 70 is received by the light detector 80, which serves as a light reception unit. The signal received by the light detector 80 is fed back to the modulator 200, and the laser light-emitting element 30 is modulated by the modulator 200.

In the following, the configuration of the atomic oscillator 10 will be described in more detail. In the second embodiment, for the sake of simplicity, a light detector 80 side of the atomic oscillator 10 will be defined as an upper side, and a package 110 (described later) side of the atomic oscillator will be defined as a lower side. However, the atomic oscillator 10 can be used upside-down, or can be arranged at an arbitrary angle. Moreover, a planar view is assumed to mean viewing an object in the direction the excitation light travels.

The atomic oscillator 10 has a circuit substrate 15. On the circuit substrate 15, main members are formed in a longitudinal direction. Specifically, on the circuit substrate 15, an alumina substrate 20 is arranged. On the alumina substrate 20, the laser light-emitting element 30 is arranged. As the laser light-emitting element 30, for example, a vertical cavity surface emitting laser (VCSEL) or the like may be employed. The alumina substrate 20 is provided with a heater 25 to control the temperature of the laser light-emitting element.

At a predetermined position above the laser light-emitting element 30, the ND filter 40 is arranged via a heat insulation spacer 101 formed of glass or the like. Above the ND filter 40, the collimator lens 50 is arranged. At a predetermined position above the ND filter 40, the quarter wavelength plate 60 is arranged via a spacer 102 formed of silicon or the like.

At a predetermined position above the quarter wavelength plate 60, the alkali metal cell 70 is arranged via a heat insulation spacer 103 formed of glass or the like. The alkali metal cell 70 has a structure in which outer edges of respective two glass substrates 71 opposed to each other are connected to each other via a silicon substrate 72. A gas of alkali metal atoms is encapsulated in a portion surrounded by the glass substrates 71 and the silicon substrate 72.

An example of the alkali metal was described as above (Cs or the like). A buffer gas, such as Ne, may be encapsulated with the gas of alkali metal atoms in the alkali metal cell 70. On both sides of the alkali metal cell 70, heater coils for the cell are arranged on surfaces of the glass substrates 71. The alkali metal cell 70 can be set at predetermined temperature.

At a predetermined position above the alkali metal cell 70, the light detector 80 is arranged via a heat insulation spacer 104 formed of a glass or the like. As the light detector 80, for example, a photodiode or the like may be used.

The respective members formed on the circuit substrate 15 are arranged, for example, in a cavity portion of a ceramic package 110. In the cavity portion of the package 110, plural internal pads 120 are arranged. The internal pad 120 is coupled to a pad portion 75 of the heater coil formed on the glass substrate 71 of the alkali metal cell 70 via a wire 131.

Moreover, the internal pad 120 is coupled to the wiring of the light detector 80 via a wire 132. Similarly, the wiring of the laser light-emitting element 30, the coil of the heater for the laser light-emitting element 30 and the like are coupled to the internal pads 120 via wire bonding or the like, respectively. The respective internal pads 120 are electrically connected with an external terminal 129 via a wire 125.

As described above, after coupling all the wirings to the internal pads 120 of the package 110, for example, a ceramic lid 140 is arranged to contact the outer periphery of the package 110 and are bonded under a high vacuum environment. Therefore, the inside of the package 110 and the lid 140 can be sealed in a high vacuum. For example, surfaces of the package 110 and the lid 140 in the region to be contacted are preliminarily metalized, a metallic bonding layer of solder, AuSn or the like is formed in each of the metallized regions, and is heated at high temperature under high vacuum, and thereby the package 110 and lid 140 can be bonded.

The external terminal 129 is coupled electrically to the modulator 200. The signal detected by the light detector 80 is fed back to the modulator 200, and thereby the modulation frequency of the laser light emitted from the laser light-emitting element 30 can be adjusted by the modulator 200.

The CPT resonance detection method (the pulse excitation method) according to the first embodiment is applied to the atomic oscillator according to the second embodiment, thereby light shift can be reduced and long-term stability can be enhanced. Moreover, power broadening is suppressed and the resonance Q-value is enhanced, and thereby high short-term stability can be obtained. Furthermore, because a specific light modulation device other than the laser light-emitting element 30 is not required, it is possible to reduce the size, cost, and power consumption of the entire apparatus in comparison to when an external device is used.

Third Embodiment

In a third embodiment, a magnetic sensor provided with the CPT resonance generation apparatus according to the first embodiment will be described as an example. In the third embodiment, explanations for the same or similar components as in the previously described embodiments may be omitted.

According to the same configuration described in the second embodiment (See FIG. 12), it is possible to enable a magnetic sensor. As shown in FIG. 8, the amount of laser light passing through the excited cesium (Cs) gas is maximized when the frequency difference of the sidebands corresponds to the difference of the eigen frequency of the Cs atoms. The difference of the eigen frequency shifts by an external magnetic field acting on the alkali metal cell 70. Accordingly, the value of the external magnetic field can be obtained by measuring the resonance frequency.

The amount of shift due to the external magnetic field differs depending on the magnetic quantum number mf of the hyperfine structure levels split according to the Zeeman effect. In a case of using the shift of the eigen frequency difference due to an external magnetic field as an atomic oscillator, a clock transition with a magnetic quantum number mf=[0,0], which has the least shift amount of the eigen frequency difference with respect to a magnetic field, is preferably used.

In contrast, when using the shift of the eigen frequency difference due to an external magnetic field as a magnetic sensor, a transition with a greater shift amount of the eigen frequency difference with respect to a magnetic field (e.g. magnetic quantum number of mf=[3,3]) is preferably used. Moreover, by measuring a difference between frequencies of magnetic quantum numbers, shift amounts of which are different from each other, it is possible to obtain the external magnetic field with a high degree of accuracy.

In the third embodiment, the CPT resonance detection method (pulse excitation method) according to the first embodiment is applied to the magnetic sensor, power broadening is suppressed and the resonance Q-value is enhanced, and thereby it is possible to detect the frequency difference with extremely high accuracy. That is, when the CPT resonance generation apparatus according to the embodiment is used as a magnetic sensor, high accuracy in reading out the external magnetic field is obtained. Moreover, because a specific light modulation device other than the laser light-emitting element 30 is not required, it becomes possible to reduce the size, cost, and power consumption of the entire apparatus in comparison to when an external device is used.

Further, the present invention is not limited to these embodiments, but various variations and modifications may be made without departing from the scope of the present invention.

What is claimed is:

1. A (CPT) resonance generation method for generating a CPT resonance, comprising:
applying an electric current to a laser light-emitting element, to emit laser light having at least two wavelengths, wherein a first value of a direct current component of the electric current applied to the laser light-emitting element in a first period is greater than an oscillation threshold for the laser light-emitting element, and a second value of the direct current component of the electric current applied to the laser light-emitting element in a second period, following the first period, is less than the first value of the direct current component of the electric current in the first period; and
irradiating an alkali metal atom with the laser light, the laser light generated in the first period and the laser light generated by in the second period entering the alkali metal atom repeatedly a plurality of times to generate a Ramsey resonance,
wherein the wavelength of the laser light in the first period increases from a value less than an absorption wavelength of the alkali metal atom to a value greater than the absorption wavelength, and decreases from the value greater than the absorption wavelength to the absorption wavelength.

2. The CPT resonance generation method according to claim 1,
wherein the second value of direct current component is less than the oscillation threshold for the laser light-emitting element.

3. The CPT resonance generation method according to claim 1,
wherein the second value of direct current component is zero.

4. A (CPT) resonance generation method for generating a CPT resonance, comprising:
applying an electric current to a laser light-emitting element, to emit laser light having at least two wavelengths, wherein a first value of a direct current component of the electric current applied to the laser light-emitting element in a first period is greater than an oscillation threshold for the laser light-emitting element, and a second value of the direct current component of the electric current applied to the laser light-emitting element in a second period, following the first period, is less than the first value of the direct current component of the electric current in the first period; and
irradiating an alkali metal atom with the laser light, the laser light generated in the first period and the laser light generated by in the second period entering the alkali metal atom repeatedly a plurality of times to generate a Ramsey resonance,
wherein a value of the electric current applied to the laser light-emitting element in the first period includes a first value immediately after a start of the first period and a second value, which is less than the first value.

5. A method for detecting the CPT resonance generated by the CPT resonance generation method according to claim 1,
wherein light passing through the alkali metal atom is detected when the wavelength of the laser light coincides with the absorption wavelength during the wavelength increases in the first period.

6. The CPT resonance detection method according to claim 5,
wherein the laser light-emitting element is a surface emitting laser.

7. The CPT resonance detection method according to claim 5,
wherein the alkali metal atom is encapsulated in a cell.

8. The CPT resonance detection method according to claim 5,
wherein the alkali metal atom is rubidium (Rb), cesium (Cs), sodium (Na) or potassium (K).

9. A CPT resonance generation apparatus comprising:
an alkali metal cell in which an alkali metal atom is encapsulated, and which laser light having at least two wavelengths enters;
a laser light-emitting element configured to emit the laser light; and
a power-supply unit configured to apply an electric current to the laser light-emitting element, wherein a first value of a direct current component of the applied electric current in a first period is greater than an oscillation threshold for the laser light-emitting element; a second value of the direct current component of the applied electric current in a second period, following the first period, is less than the first value of the direct current component; and the first period and the second period are repeated a plurality of times.

10. The CPT resonance generation apparatus according to claim 9,
wherein the laser light-emitting element is a surface emitting laser.

11. An atomic oscillator comprising:
the CPT resonance generation apparatus according to claim 9; and
a light reception unit configured to receive light passing through the alkali metal cell.

12. A magnetic sensor comprising:
the CPT resonance generation apparatus according to claim 9; and
a light reception unit configured to receive light passing through the alkali metal cell.

13. The CPT resonance generation method according to claim 4,
wherein the second value of direct current component is less than the oscillation threshold for the laser light-emitting element.

14. The CPT resonance generation method according to claim 4,
wherein the second value of direct current component is zero.

15. A method for detecting the CPT resonance generated by the CPT resonance generation method according to claim 4,
wherein light passing through the alkali metal atom is detected when the wavelength of the laser light coincides with an absorption wavelength, while the wavelength increases in the first period.

16. The CPT resonance detection method according to claim 15,
wherein the laser light-emitting element is a surface emitting laser.

17. The CPT resonance detection method according to claim 15,
wherein the alkali metal atom is encapsulated in a cell.

18. The CPT resonance detection method according to claim 15,
wherein the alkali metal atom is rubidium (Rb), cesium (Cs), sodium (Na) or potassium (K).

* * * * *